US012791609B2

(12) United States Patent
Tian et al.

(10) Patent No.: US 12,791,609 B2
(45) Date of Patent: Nov. 10, 2026

(54) TEST KEY STRUCTURE AND TEST METHOD THEREOF

(71) Applicant: United Semiconductor (Xiamen) Co., Ltd., Xiamen (CN)

(72) Inventors: Jie Huai Tian, Shamen City (CN); Rong He, Shamen City (CN); Hailong Gu, Singapore (SG); Wen Yi Tan, Xiamen (CN); Jin Hui Yu, Shamen City (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 218 days.

(21) Appl. No.: 18/664,315

(22) Filed: May 15, 2024

(65) Prior Publication Data

US 2025/0334631 A1 Oct. 30, 2025

(30) Foreign Application Priority Data

Apr. 24, 2024 (CN) ......................... 202410501194.7

(51) Int. Cl.
*G01R 31/28* (2006.01)
*G01R 27/02* (2006.01)

(52) U.S. Cl.
CPC ......... *G01R 31/2886* (2013.01); *G01R 27/02* (2013.01)

(58) Field of Classification Search
CPC ............................ G01R 31/2886; G01R 27/02
See application file for complete search history.

(56) References Cited

U.S. PATENT DOCUMENTS 10,553,537 B2 * 2/2020 Takahashi ........... H10W 20/063
2023/0043884 A1 * 2/2023 Chuang .............. H10W 20/063

* cited by examiner

*Primary Examiner* — Alesa Allgood
(74) *Attorney, Agent, or Firm* — Winston Hsu

(57) ABSTRACT

The invention provides a test key structure, which comprises two conductive pads arranged adjacent to each other, a first space is between the two conductive pads, two vertical contact plugs respectively located below the two conductive pads and electrically connected with the two conductive pads, and a test conductive layer located below and electrically connected with the two vertical contact plugs, when views from a top view, the test conductive layer presents a snake-shaped arrangement pattern.

13 Claims, 5 Drawing Sheets

TEST KEY STRUCTURE AND TEST METHOD THEREOF

BACKGROUND OF THE INVENTION

1. Field of the Invention

The invention relates to the field of semiconductor manufacturing, in particular to a test key structure with conductive pads and a test method thereof.

2. Description of the Prior Art

In the semiconductor manufacturing process, after electronic components and multi-layer circuit layers are formed on the substrate, redistribution layers or conductive pads are often formed on the top of the stacked circuit layers to connect these electronic components to other larger pins and to connect other electronic components or voltage sources.

With the development of semiconductor technology, the sizes of various devices are getting smaller and smaller, and even a semiconductor structure in which two different wafers are bonded to each other by hybrid bond technology has been developed. Under this development trend, the component density is getting higher and higher, and the size of the conductive pad on the top surface is gradually shrinking. In addition, when the top conductive pad is formed, it may damage other underlying devices during the formation process, and these damages are difficult to be detected in the general semiconductor manufacturing process.

SUMMARY OF THE INVENTION

In order to solve the above problems, the present invention provides a test key structure, which comprises two conductive pads arranged adjacent to each other, wherein there is a first spacing distance between the two conductive pads, two vertical contact plugs respectively located below and electrically connected with the two conductive pads, and a test conductive layer located below and electrically connected with the two vertical contact plugs, wherein from a top view, the test conductive layer presents a snake-shaped arrangement pattern.

The invention also provides a testing method for testing key structure, which comprises providing a testing key structure, wherein the testing key structure comprises two conductive pads which are arranged adjacent to each other, wherein the two conductive pads have a first spacing distance, two vertical contact plugs which are respectively positioned below and electrically connected with the two conductive pads, and a testing conductive layer which is positioned below and electrically connected with the two vertical contact plugs, wherein the testing conductive layer presents a snake-shaped arrangement pattern from a top view, and an electrical testing step is then performed on the two conductive pads.

The invention is characterized by providing a test key structure with a conductive pad and a test method thereof. Because the applicant found that when two adjacent conductive pads with a distance between them are formed in the device region of a semiconductor, cracks are easily generated under the gap between the two conductive pads due to the stress, and the cracks are too fine to be easily detected in the general semiconductor manufacturing process. Therefore, in the test key region next to the device region, a test key structure with the same size as the conductive pad in the device region is arranged, and a snake-shaped circuit layer (test conductive layer) is also arranged below the test key structure. Therefore, if cracks occur between the test key structures in the test key region, the cracks will cut off the snake-shaped circuit layer below, causing the components of the test key to be disconnected. In this way, the manufacturer can find the defects of the device in real time, adjust the process parameters to improve the semiconductor device, and then improve the yield of the overall semiconductor process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

In order to make the following easier to understand, readers can refer to the drawings and their detailed descriptions at the same time when reading the present invention. Through the specific embodiments in the present specification and referring to the corresponding drawings, the specific embodiments of the present invention will be explained in detail, and the working principle of the specific embodiments of the present invention will be expounded. In addition, for the sake of clarity, the features in the drawings may not be drawn to the actual scale, so the dimensions of some features in some drawings may be deliberately enlarged or reduced.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Although the present invention uses the terms first, second, third, etc. to describe elements, components, regions, layers, and/or sections, it should be understood that such elements, components, regions, layers, and/or sections should not be limited by such terms. These terms are only used to distinguish one element, component, region, layer and/or block from another element, component, region, layer and/or block. They do not imply or represent any previous ordinal number of the element, nor do they represent the arrangement order of one element and another element, or the order of manufacturing methods. Therefore, the first element, component, region, layer or block discussed below can also be referred to as the second element, component, region, layer or block without departing from the specific embodiments of the present invention.

The term "about" or "substantially" mentioned in the present invention usually means within 20% of a given value or range, such as within 10%, or within 5%, or within 3%, or within 2%, or within 1%, or within 0.5%. It should be noted that the quantity provided in the specification is approximate, that is, the meaning of "about" or "substantially" can still be implied without specifying "about" or "substantially".

The terms "coupling" and "electrical connection" mentioned in the present invention include any direct and indirect means of electrical connection. For example, if the first component is described as being coupled to the second component, it means that the first component can be directly electrically connected to the second component, or indirectly electrically connected to the second component through other devices or connecting means.

Although the invention of the present invention is described below by specific embodiments, the inventive principles of the present invention can also be applied to other embodiments. In addition, in order not to obscure the spirit of the present invention, specific details are omitted, and the omitted details are within the knowledge of those with ordinary knowledge in the technical field.

Figure 1:
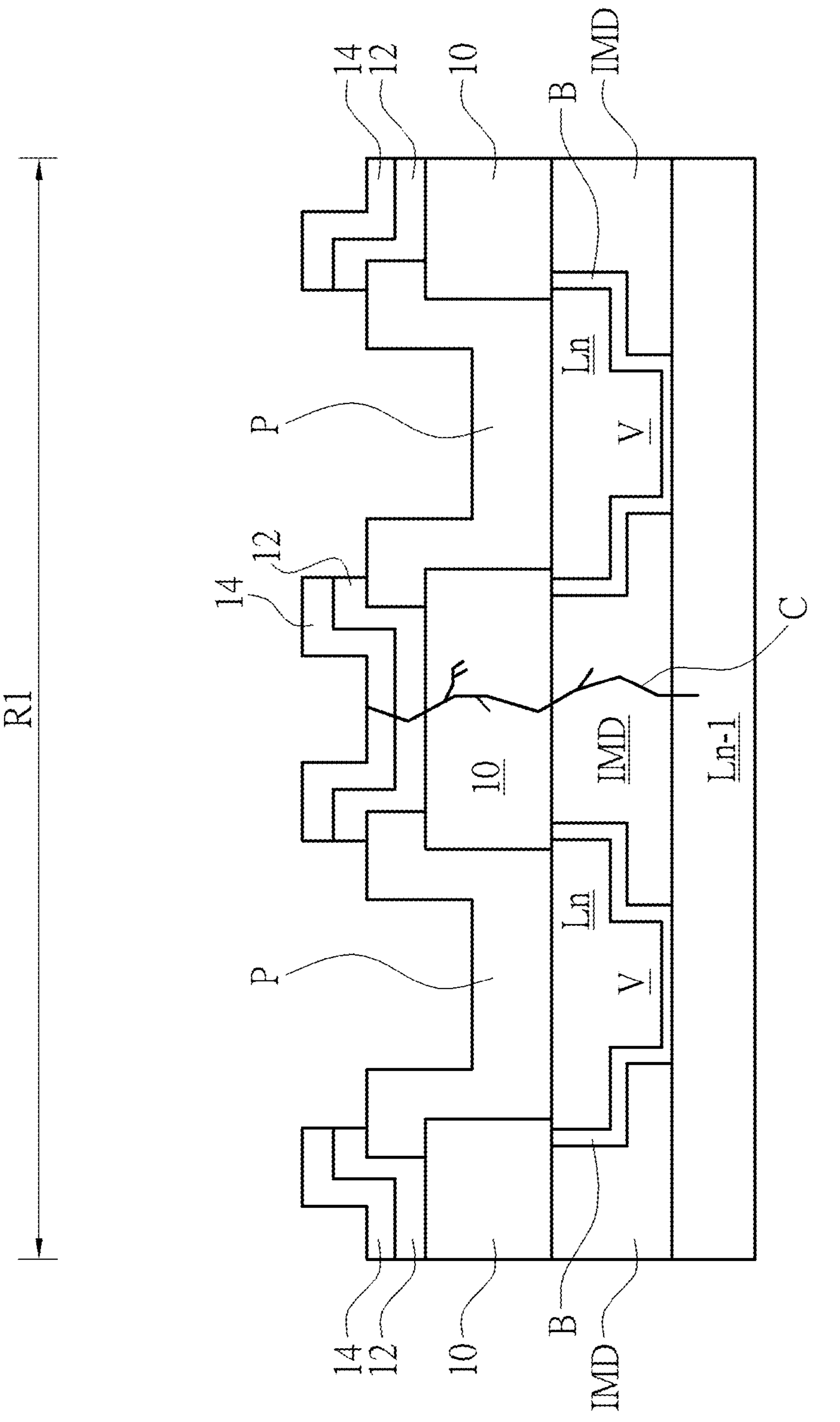
FIG. 1 is a schematic cross-sectional view of a semiconductor structure including conductive pads near the top surface in a device region.
Figure 2:
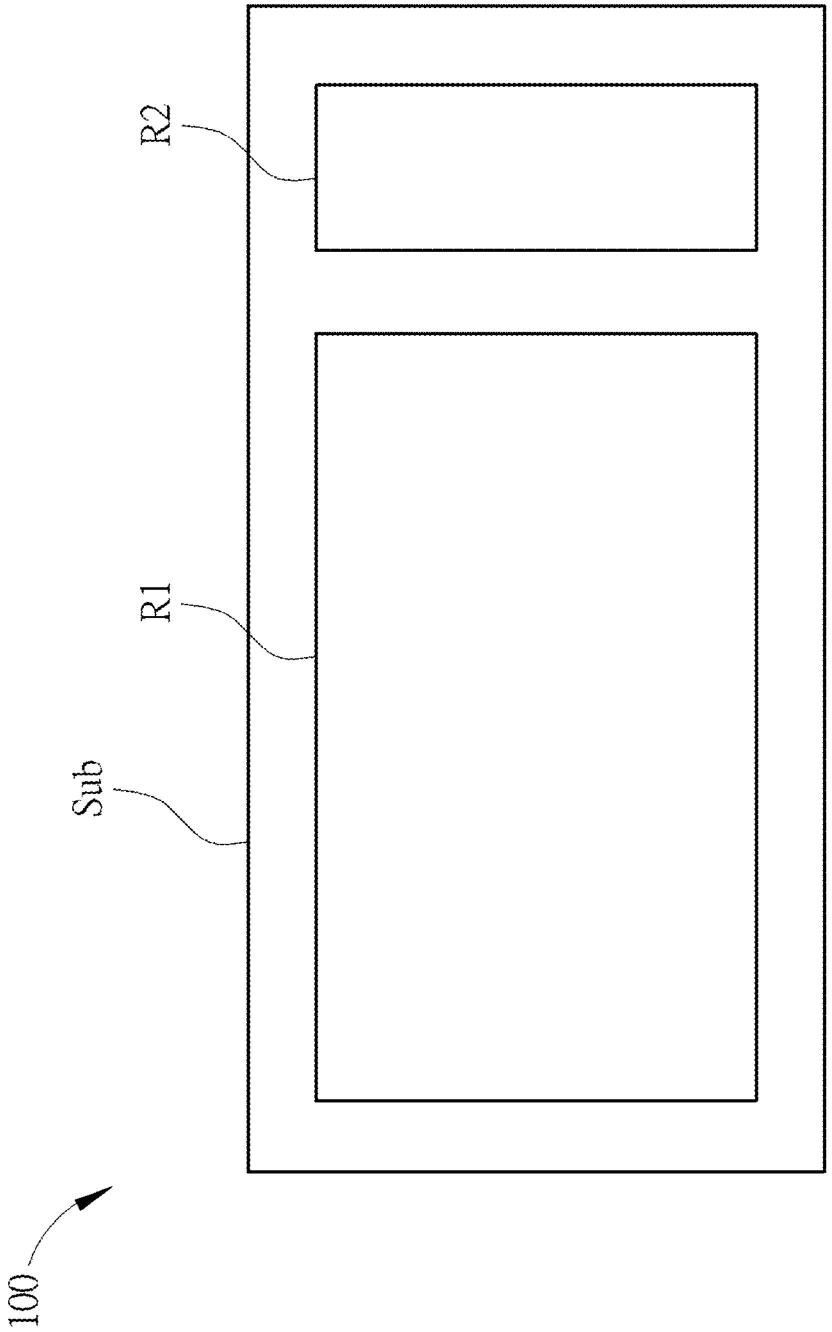
FIG. 2 is a top view of the device region and the test key region of the semiconductor structure.

Referring to FIG. 1 and FIG. 2, according to an embodiment of the present invention, firstly, a substrate Sub is provided, and a device region R1 is defined on the substrate Sub, and a plurality of electronic elements and circuit layers are formed in the device region R1. The electronic elements described here are transistors, capacitors, inductors, resistors, memories, power amplifiers or other logic circuits, etc., but the present invention is not limited thereto. Then a circuit layer is formed above the electronic component, and the function of the circuit layer is to electrically connect the electronic component to other layers above, and then electrically connect other electronic components or voltage sources through conductive pads. Usually, the circuit layer is a multi-layer stacked structure, which includes horizontally extending conductive layers (often called a metal layers) and vertical contact plugs (often called vias). Other technologies related to electronic components and circuit layers are known in this field, and will not be described here.

After the multi-layer circuit layer is formed, conductive pads are usually formed on the top of the circuit layer. The function of the conductive pads is to provide a larger pin for connecting other electronic components. Please refer to FIG. 1, which shows a schematic cross-sectional structure of a semiconductor structure including conductive pads near the top surface in a device region. As shown in FIG. 1, in the device region R1, the conductive layer Ln-1 represents the penultimate conductive layer (i.e., the second horizontal conductive layer in the multilayer circuit layers from top to bottom), the conductive layer Ln represents the uppermost horizontal conductive layer in the multilayer circuit layers, and the vertical contact plug V represents the vertical contact plug connecting the conductive layer Ln-1 and the conductive layer Ln. The materials of the conductive layer Ln-1, the conductive layer Ln and the vertical contact plug V described here are, for example, metals, such as tungsten, cobalt, copper, aluminum, gold, silver, etc., but are not limited thereto. In addition, the conductive layer Ln-1, the conductive layer Ln and the vertical contact plug V are all located in a dielectric layer, such as the dielectric layer IMD shown in FIG. 1. The material of the dielectric layer IMD is, for example, silicon oxide, silicon nitride or silicon oxynitride, but not limited to this. The outer side of the conductive layer Ln-1, the conductive layer Ln and the vertical contact plug V may optionally include barrier layers B, and the material of the barrier layer B is titanium/titanium nitride, for example, which can help the metal material to be better formed in the dielectric layer IMD.

It is worth noting that FIG. 1 shows a schematic cross-sectional structure of a semiconductor structure near the top surface in a device region. Therefore, other circuit layers and electronic components can be included under the conductive layer Ln-1. However, for the sake of simplicity, these circuit layers (including the conductor layer and the vertical contact plug) and electronic components of the other layers below are omitted and not drawn, which will be described here first.

Next, conductive pad structures are continuously formed on the conductive layer Ln. The conductive pad structures include conductive pads P, which are located in the oxide layer 10. In addition, it may also include a passivation layer 12 and a mask layer 14 above the oxide layer 10. In this embodiment, each conductive pad P is made of aluminum, the oxide layer 10 is made of silicon oxide, the passivation layer 12 is made of borophosphosilicate glass (PSG), and the mask layer 14 is made of silicon nitride, but the present invention is not limited to this. Seen from the cross section, each conductive pad P may have a U-shaped cross section, in which the bottom surface of the conductive pad P directly contacts the underlying conductive layer Ln and is electrically connected with it. In addition, a part of the conductive pad P is located on the oxide layer 10 and covers the top surface of the oxide layer 10 in this embodiment. The passivation layer 12 and the mask layer 14 are located on the oxide layer 10, and in this embodiment, a part of the passivation layer 12 and the mask layer 14 cover the sidewall and part of the top surface of the conductive pad P, but the present invention is not limited to this.

In the following steps, the conductive pad P may contact with other electronic components or signal sources, for example, an electrical signal can be connected to provide power to the electronic components to drive the electronic components. Here, for the sake of simplicity of the drawing, the structures above the subsequent scheduled connection conductive pads P are not drawn.

With the development of semiconductor technology, the size of the semiconductor structure shown in FIG. 1 is getting smaller and smaller. The applicant found that if the conductive pads P are arranged in pairs with a certain distance apart, it is speculated that the other material layers below are more likely to crack due to stress accumulation during the manufacturing process. In more detail, as shown in FIG. 1, during the manufacturing process, cracks C may occur, which are mainly located between two adjacent conductive pads P and extend downward from the mask layer 14, the passivation layer 12 and the oxide layer 10. If the depth of the crack C is deep enough, it may even extend down to the dielectric layer IMD and even break the conductive layer Ln-1.

The generation of the above-mentioned crack C is not easy to be found in the semiconductor manufacturing process immediately, so it is not easy to be found in the wafer acceptance test (WAT). In some cases, a manufacturer uses a certain set of process parameters to process a semiconductor device. Even if crack C occurs, because the position of the circuit layer does not overlap with crack C, crack C does not break the lower circuit layer, which will not affect the electrical properties of the semiconductor device at this time. At this time, the manufacturer may mistakenly think that crack C will not occur for this set of process parameters. However, if the manufacturer uses the same set of process parameters to process another semiconductor device, crack C may also occur, and the shape of the circuit layer of another semiconductor device may be different from that of the previous semiconductor device, resulting in the overlap of crack C and the circuit layer in another semiconductor device, resulting in the circuit layer being cut off by crack C. Therefore, it not only causes damage to the circuit layer, but also makes it difficult for the manufacturer to find out the cause of the damage to the semiconductor device.

Therefore, in order to solve the above problems, the present invention provides a test key structure, the principle of which is to provide a pair of conductive pads with the same size as the device region, and set a snake-shaped test conductive layer under the pair of conductive pads to simulate the occurrence of cracks in the device region, and when cracks occur, the snake-shaped test conductive layer can be used to find the occurrence of cracks in real time. Explain in detail the following paragraphs.

Figure 3:
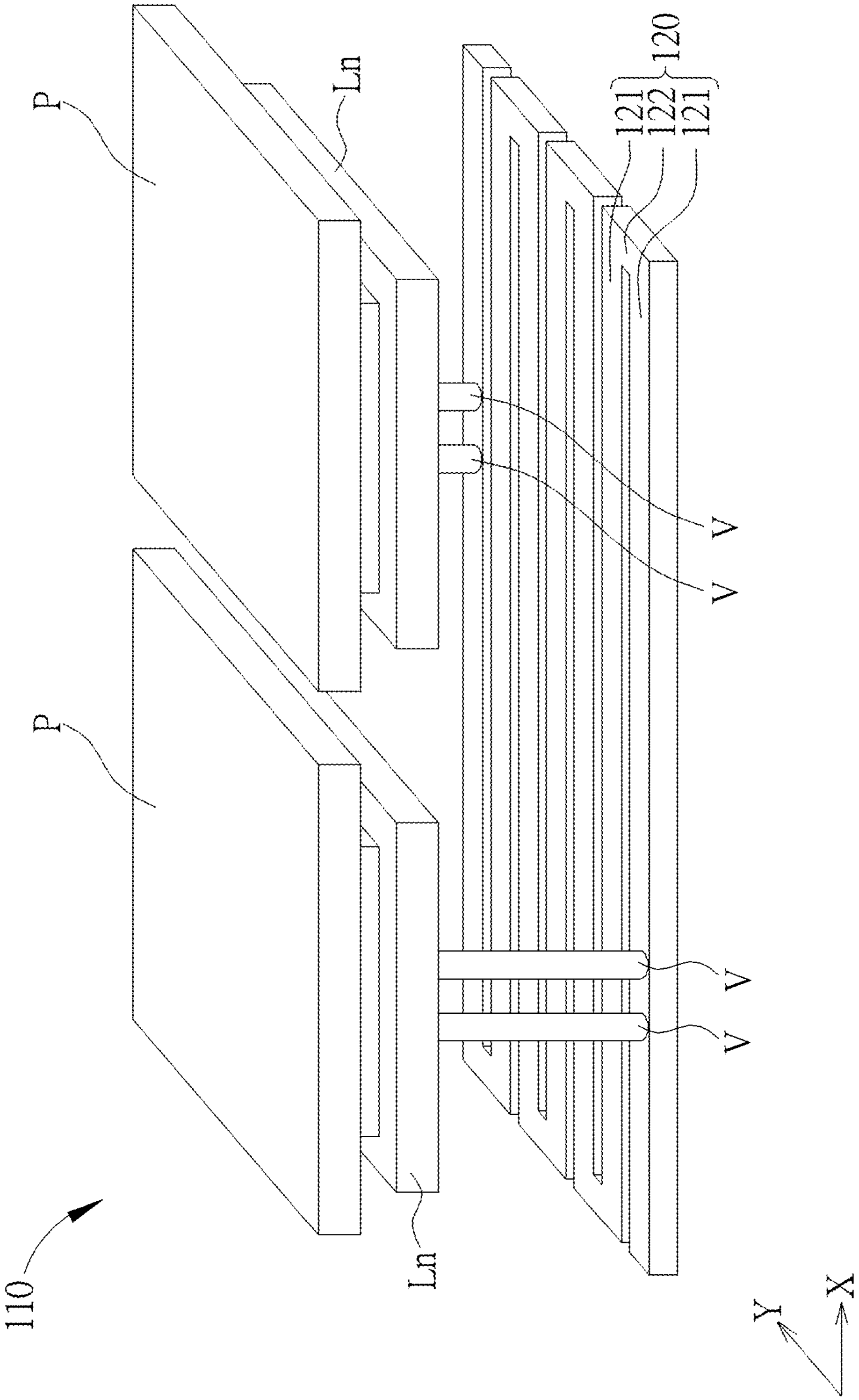
FIG. 3 is a schematic diagram showing the three-dimensional structure of the test key structure in the test key region of the present invention.
Figure 4:
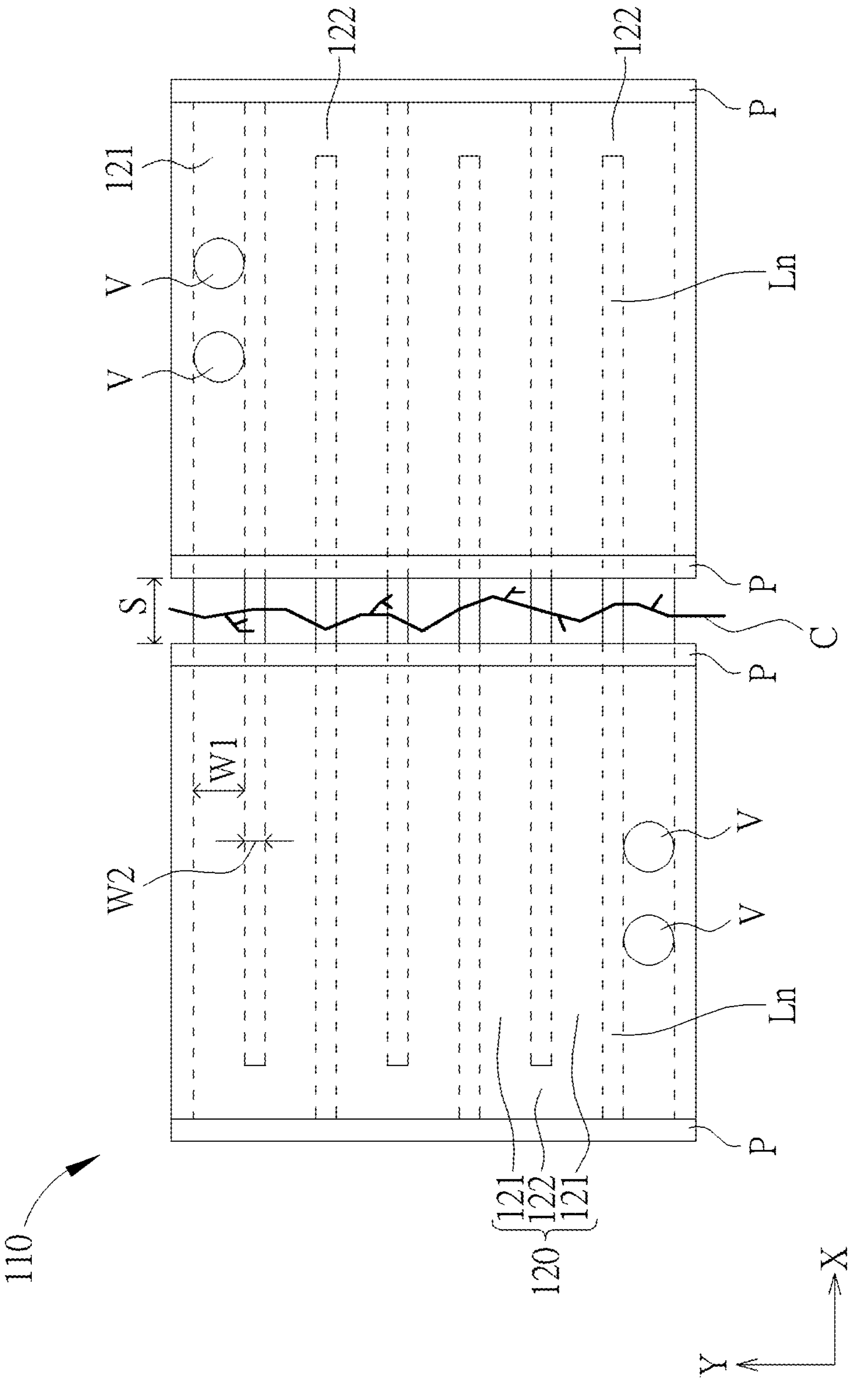
FIG. 4 is a top view of the test key structure of the present invention in the test key region.

Please refer to FIG. 2, FIG. 3 and FIG. 4. FIG. 2 is a top view of the device region and the test key region of the semiconductor structure, FIG. 3 is a schematic diagram showing the three-dimensional structure of the test key structure in the test key region of the present invention, and FIG. 4 is a top view of the test key structure of the present invention in the test key region. As shown in FIG. 2, a semiconductor structure 100 includes a device region R1 and a test key region R2 located on a substrate Sub, wherein the device formed in the device region R1 will be the device actually needed to be used after the process is completed, that is, the formation region of the semiconductor structure shown in FIG. 1, and the test key region R2 is, for example, a peripheral region next to the device region or a dummy region, which can be used to form a test key. In FIG. 2, other elements located in the device region R1 and the test key region R2 are omitted for simplicity.

As shown in FIGS. 3 and 4, a test key structure 110 is provided in an embodiment of the present invention, and the test key structure 110 is located in the test key region R2. The test key structure 110 includes two paired conductive pads P, with a conductive layer Ln below the conductive pad P, a vertical contact plug V below the conductive layer Ln, and a snake-shaped test conductive layer 120 below the vertical contact plug V. The vertical contact plug V directly contacts and electrically connects the snake-shaped test conductive layer 120 and the conductive layer Ln, and the conductive layer Ln also directly contacts and electrically connects the conductive pad P and the vertical contact plug V. The conductive pad P, the conductive layer Ln and the vertical contact plug V described here are the same as those in the semiconductor structure in the device region R1, respectively, so they are labeled with the same symbols, and the same features are not repeated here. However, it is worth noting that the conductive pad P, the conductive layer Ln, the vertical contact plug V and the snake-shaped test conductive layer 120 in the test key structure 110 are all formed in the test key region R2, but not in the device region R1.

In addition, in this embodiment, the areas of the two paired conductive pads P are equal, and the distance between the two paired conductive pads P is defined as S, where S may be equal to less than or equal to 3.5 microns, or approximately equal to 6 microns. Or the areas of the two paired conductive pads P are not equal, and the distance S between the two conductive pads P is approximately equal to 4.5 microns. Through the experimental results of the applicant, it is found that under the above conditions, the probability of cracks between conductive pads P is high, so it is necessary to pay attention to whether cracks occur between conductive pads P in the process. However, it can be understood that the above-mentioned condition ranges are only some examples of the present invention, but the present invention is not limited to this, that is, if the distance between pairs of conductive pads P is other values, it also falls within the scope of the present invention.

In addition, please continue to refer to FIGS. 3 and 4. In this embodiment, the vertical contact plug V is electrically connected to both ends (the head end and the tail end) of the snake-shaped test conductive layer 120, and the snake-shaped test conductive layer 120 includes a plurality of first conductive lines 121 arranged in a first direction (for example, the X direction in FIG. 4) and a plurality of second conductive lines 122 arranged in a second direction (for example, the Y direction in FIG. 4), wherein the two ends of each second conductive line 122 are connected in series with the ends of two first conductive lines 121, and then a plurality of first conductive lines 121 are connected in series in a repeated "S" shape or a snake shape. The width of the first conductive lines 121 is defined as W1, and the spacing between two adjacent first conductive lines 121 is defined as W2. In this embodiment, it is preferable that W1>W2, so that the snake-shaped test conductive layer 120 has a higher pattern density, and when cracks are generated, the probability that the cracks overlap with the snake-shaped test conductive layer 120 is greater. However, the present invention is not limited to this. The actual size of the snake-shaped test conductive layer 120, the length and width of each first conductive line 121 and second conductive line 122, or the spacing between the first conductive lines 121 and the arrangement of the second conductive lines 122 can be adjusted according to actual needs.

In addition, the extending direction of the gap between the two conductive pads P is preferably perpendicular to the extending direction of the first conductive line 121 of the snake-shaped test conductive layer 120. For example, as shown in FIG. 3 or FIG. 4, the gaps between the conductive pads P are arranged along the Y direction, and the first conductive lines 121 of the snake-shaped test conductive layer 120 are preferably arranged along the X direction. In this way, when cracks occur between the conductive pads P, cracks may also occur along the Y direction, so that there is a high probability of overlapping with the first conductive line 121 of the snake-shaped test conductive layer 120, and then the first conductive line 121 is cut off to achieve the detection effect.

In the actual testing step, because the vertical contact plugs V are electrically connected to the two ends of the snake-shaped test conductive layer 120, the snake-shaped test conductive layer 120 forms a circuit under the voltage applied to the vertical contact plugs V at both ends. If a signal detector is connected to the circuit, a normal signal can be measured, for example, a preset resistance value in a normal range can be obtained when measuring the resistance of the circuit. However, if the lower snake-shaped test conductive layer 120 is cut off due to crack C during the manufacturing process, normal signals cannot be measured. For example, when measuring the resistance value, it is usually found that the resistance value becomes higher than the normal range. When this happens, it usually means that the circuit formed by the snake-shaped test conductive layer 120 has been affected or cut off by the crack.

When it is found in the test step that the circuit of the snake-shaped test conductive layer 120 in the test key region R2 is cut off, it is likely that cracks have occurred between the conductive pads P. Because the device region R1 also contains pairs of conductive pads with the same size, cracks may also occur between pairs of conductive pads P in the device region R1. At this time, the manufacturer can inspect the process and adjust the process parameters to prevent cracks from affecting the semiconductor devices. Therefore, by the method of the invention, the generation of cracks between pairs of conductive pads can be found in real time.

Figure 5:
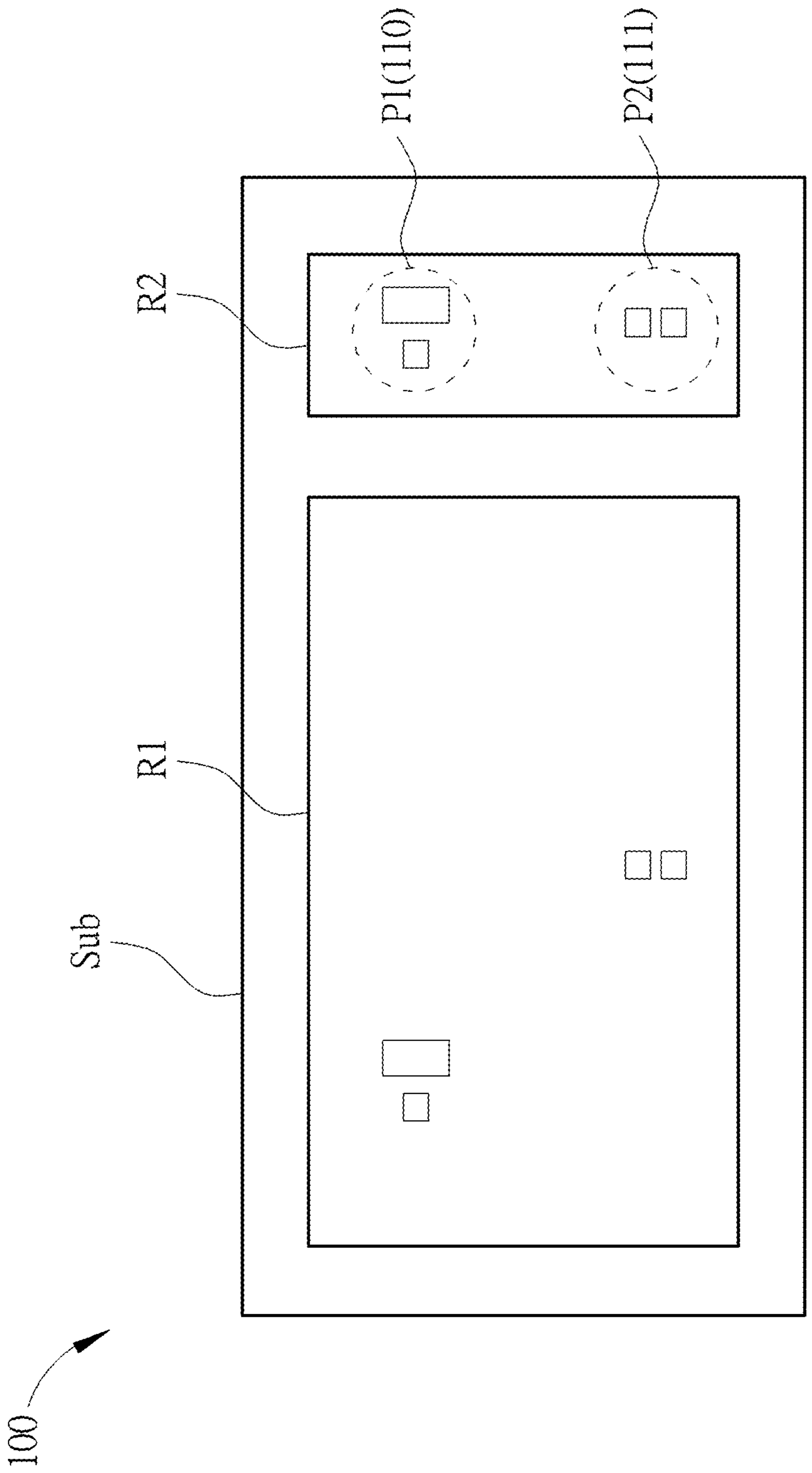
FIG. 5 is a schematic top view showing that the device region and the test key region of the semiconductor structure contain conductive pads with the same size.

FIG. 5 is a schematic top view showing that the device region and the test key region of the semiconductor structure contain conductive pads with the same size. As shown in FIG. 5, in some embodiments, the device region R1 may contain more than one pair of conductive pads, but more than two pairs of conductive pads, which are defined as P1 and P2 respectively, wherein the areas of two conductive pads in the two groups of conductive pads P1 and P2 may be the same or different from each other, and the spacing between the two conductive pads may be adjusted as required. In order to simulate whether cracks will occur between the conductive pad pairs P1 or P2 in the device region R1 in the test key region R2, conductive pad pairs P1 and P2 with the same size are also formed in the test key region R2, and a snake-shaped test conductive layer 120 is arranged below the conductive pad pairs P1 and P2 in the test key region R2. That is, the conductive pad pair P1 located in the test key region R2 in FIG. 5 can be regarded as one test key structure 110, and another conductive pad pair P2 located in the test key region R2 can be regarded as another test key structure 111. In other words, in this embodiment, a plurality of different test keys can be set in the test key region R2, and each test key can have the same size as one of the conductive pad pairs P1 or P2 in the device region R1. It can be understood that the present invention also covers setting more test keys (more than two) in the test key region R2, which is also within the scope of the present invention.

In addition, in FIG. 5, for the sake of simplicity, other elements except the conductive pad pair located in the device region R1 and the test key region R2 are omitted.

Based on the above description and drawings, the present invention provides a test key structure 110, which comprises two conductive pads P arranged adjacent to each other, wherein there is a first spacing distance S between the two conductive pads P, two vertical contact plugs V respectively located below and electrically connected with the two conductive pads P, and a test conductive layer 120 located below and electrically connected with the two vertical contact plugs V, wherein the test conductive layer 120 presents a snake-shaped arrangement pattern when viewed from a top view.

In some embodiments of the present invention, the snake-shaped arrangement pattern comprises a plurality of first conductive lines 121 arranged along a first direction (e.g., X direction) and parallel to each other, and a plurality of second conductive lines 122 arranged along a second direction (e.g., Y direction) and parallel to each other, wherein each second conductive line 122 connects each first conductive line 121 and forms a continuous conductive line pattern.

In some embodiments of the present invention, a gap distance W2 between parallel first conductive lines 121 is smaller than a width W1 of each first conductive line 121.

In some embodiments of the present invention, two vertical contact pillars V respectively contact a head end and a tail end of the test conductive layer 120.

In some embodiments of the present invention, it further comprises two conductive layers Ln, which are respectively located between two conductive pads P and two vertical contact plugs V, wherein the conductive layers Ln electrically connect the conductive pads P and the vertical contact plugs V.

In some embodiments of the present invention, an oxide layer 10 is further included between the two conductive pads P.

In some embodiments of the present invention, a crack C is located in the oxide layer 10, and the crack C passes through the test conductive layer 120.

In some embodiments of the present invention, a passivation layer 12 is further included, which is located on the oxide layer 10, and part of the passivation layer 12 covers one side and a top surface of the conductive pad P (as shown in FIG. 1).

In some embodiments of the present invention, the first spacing distance S between two conductive pads P is less than or equal to 3.5 microns.

In some embodiments of the present invention, the first spacing distance S between two conductive pads P is approximately equal to 6 microns.

In some embodiments of the present invention, the first spacing distance S between two conductive pads P is approximately equal to 4.5 microns.

In some embodiments of the present invention, the materials of the two conductive pads P include aluminum.

In some embodiments of the present invention, the test key structure 110 is located in the test key region R2, and the test key region R2 is located next to the device region R1.

In some embodiments of the present invention, the areas of the two conductive pads P are the same.

In some embodiments of the present invention, the areas of the two conductive pads P are different.

In some embodiments of the present invention, another test key structure (for example, the test key structure 111 in FIG. 5) is further included, and the other test key structure 111 includes two second conductive pads arranged adjacent to each other, wherein there is a second spacing distance between the two second conductive pads, and the second spacing distance is different from the first spacing distance (in FIG. 5, the distances between the conductive pads included in the conductive pad pair P1 and the conductive pad pair P2 may be different).

The invention also provides a test method for testing key structure, which comprises providing a test key structure 110, wherein the test key structure 110 comprises two conductive pads P arranged adjacent to each other, wherein a first spacing distance S exists between the two conductive pads P, two vertical contact plugs V are respectively positioned below the two conductive pads P and electrically connected with the two conductive pads P, and a test conductive layer 120 is positioned below the two vertical contact plugs V and electrically connected with the two vertical contact plugs V, wherein the test conductive layer 120 presents a snake-shaped arrangement pattern when viewed from a top view. Afterwards, an electrical testing step is performed on the two conductive pads.

In some embodiments of the present invention, the electrical testing step includes applying a voltage to a circuit formed by two conductive pads P, two vertical contact plugs V and testing the conductive layer 120, and measuring whether a resistance value of the circuit is greater than a preset value.

In some embodiments of the present invention, if the measured resistance value is greater than the preset value, a process adjustment step is performed (representing that the circuit may have broken at this time).

The invention is characterized by providing a test key structure with a conductive pad and a test method thereof. Because the applicant found that when two adjacent conductive pads with a distance between them are formed in the device region of a semiconductor, cracks are easily generated under the gap between the two conductive pads due to the stress, and the cracks are too fine to be easily detected in the general semiconductor manufacturing process. Therefore, in the test key region next to the device region, a test key structure with the same size as the conductive pad in the device region is arranged, and a snake-shaped circuit layer (test conductive layer) is also arranged below the test key structure. Therefore, if cracks occur between the test key structures in the test key region, the cracks will cut off the snake-shaped circuit layer below, causing the components of the test key to be disconnected. In this way, the manufacturer can find the defects of the device in real time, adjust the process parameters to improve the semiconductor device, and then improve the yield of the overall semiconductor process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key structure, comprising:

two conductive pads arranged adjacent to each other, wherein a first spacing distance exists between the two conductive pads;

two vertical contact plugs, respectively located below the two conductive pads and electrically connected with the two conductive pads;

a test conductive layer located below the two vertical contact plugs and electrically connected with the two vertical contact plugs, wherein the test conductive layer presents a snake-shaped arrangement pattern when viewed from a top view;

an oxide layer located between the two conductive pads; and a crack in the oxide layer, and the crack passes through the test conductive layer.

2. The test key structure according to claim 1, wherein the two vertical contact plugs respectively contact a head end and a tail end of the test conductive layer.

3. The test key structure according to claim 1, further comprising two conductive layers respectively located between the two conductive pads and the two vertical contact plugs, wherein the conductive layers electrically connect the conductive pads and the vertical contact plugs.

4. The test key structure according to claim 1, further comprising a passivation layer located on the oxide layer and partially covering one side and a top surface of the conductive pad.

5. The test key structure according to claim 1, wherein the first spacing distance between the two conductive pads is less than or equal to 3.5 microns.

6. The test key structure according to claim 1, wherein the first spacing distance between the two conductive pads is approximately equal to 6 microns.

7. The test key structure according to claim 1, wherein the first spacing distance between the two conductive pads is approximately equal to 4.5 microns.

8. The test key structure according to claim 1, wherein the test key structure is located in a test key region, and the test key region is located beside a device region.

9. The test key structure according to claim 1, wherein the two conductive pads have the same area.

10. The test key structure according to claim 1, wherein the areas of the two conductive pads are different.

11. The test key structure according to claim 1, further comprising another test key structure, and the other test key structure comprises two second conductive pads arranged adjacently, wherein there is a second spacing distance between the two second conductive pads, and the second spacing distance is different from the first spacing distance.

12. The test key structure according to claim 1, wherein the snake arrangement pattern comprises:

a plurality of first conductive lines arranged along a first direction and parallel to each other;

a plurality of second conductive lines arranged along a second direction and parallel to each other, wherein each second conductive line is connected with each first conductive line and forms a continuous conductive line pattern.

13. The test key structure according to claim 12, wherein a gap distance between the parallel first conductive lines is smaller than a width of each first conductive line.

* * * * *